United States Patent
Whitby et al.

(10) Patent No.: US 11,490,495 B2
(45) Date of Patent: Nov. 1, 2022

(54) NFC-POWERED LED STICKER WITH INTEGRAL CAPACITOR

(71) Applicant: Nthdegree Technologies Worldwide Inc., Tempe, AZ (US)

(72) Inventors: Rodger Whitby, Queensland (AU); Bradley S. Oraw, Chandler, AZ (US)

(73) Assignee: NthDegree Technologies Worldwide, Inc., Tempe, AZ (US)

( * ) Notice: Subject to any disclaimer, the term of this patent is extended or adjusted under 35 U.S.C. 154(b) by 416 days.

(21) Appl. No.: 16/884,295

(22) Filed: May 27, 2020

(65) Prior Publication Data

US 2021/0321504 A1 Oct. 14, 2021

Related U.S. Application Data

(60) Provisional application No. 63/007,112, filed on Apr. 8, 2020.

(51) Int. Cl.
*H05B 47/19* (2020.01)
*H05B 45/00* (2022.01)
(Continued)

(52) U.S. Cl.
CPC ........... *H05B 47/19* (2020.01); *A41D 27/205* (2013.01); *G08B 5/36* (2013.01); *G09F 3/02* (2013.01);
(Continued)

(58) Field of Classification Search
CPC ........ H05B 47/19; H05B 45/10; H05B 45/00; H05B 47/115; A41D 27/205; G08B 5/36;
(Continued)

(56) References Cited

U.S. PATENT DOCUMENTS

| | | | | |
|---|---|---|---|---|
| 9,534,772 | B2 * | 1/2017 | Lowenthal | H01L 33/06 |
| 2015/0022081 | A1 * | 1/2015 | Li | H01L 27/3225 |
| | | | | 315/34 |
| 2017/0302336 | A1 * | 10/2017 | Rotzoll | H04B 5/0056 |

FOREIGN PATENT DOCUMENTS

WO 2019240993 A1 12/2019

OTHER PUBLICATIONS

EP 21167298.5, Extended European Search Report, dated Aug. 30, 2021, 8 pages.

* cited by examiner

*Primary Examiner* — Minh D A
(74) *Attorney, Agent, or Firm* — Patent Law Group; Brian Ogonowsky

(57) ABSTRACT

An LED sticker is disclosed that receives an NFC transmission from a nearby smartphone to energize LEDs in the sticker. A spiral (or loop) antenna is used in the sticker to generate power from the NFC transmission. The NFC signal is at 13.56 MHz, which is the resonant frequency of the NFC antenna circuit in the smartphone. The LED portion is formed by sandwiching pre-formed microscopic LEDs between two conductive layers to connect the LEDs in parallel. The conductive layers form a relatively large integral capacitor that is used to achieve the 13.56 MHz resonant frequency. So no additional capacitor is needed in the circuit to achieve a resonance of 13.56 MHz. This greatly reduces the design requirements of the antenna. The LED sticker may also contain an NFC tag having its own independent loop antenna and NFC chip. Various practical applications of the LED sticker are disclosed.

22 Claims, 6 Drawing Sheets

(51) Int. Cl.
 *H05B 45/10* (2020.01)
 *A41D 27/20* (2006.01)
 *G08B 5/36* (2006.01)
 *G09F 3/02* (2006.01)
 *G09F 13/04* (2006.01)
 *H01L 25/16* (2006.01)

(52) U.S. Cl.
 CPC ........ *G09F 13/0409* (2013.01); *H01L 25/167* (2013.01); *H05B 45/10* (2020.01); *G09F 2003/0257* (2013.01)

(58) Field of Classification Search
 CPC .................. G09F 3/02; G09F 13/0409; G09F 2003/0257; G09F 13/22; G09F 2013/222; H01L 25/167; G06K 19/07798; G06K 19/07705; G06K 19/0709; G06K 19/07758; G06K 7/10297; Y02B 20/40; G01R 13/0281
 See application file for complete search history.

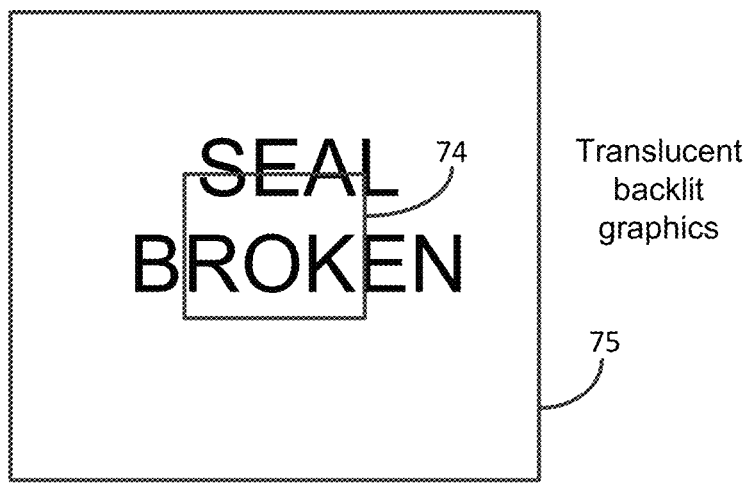
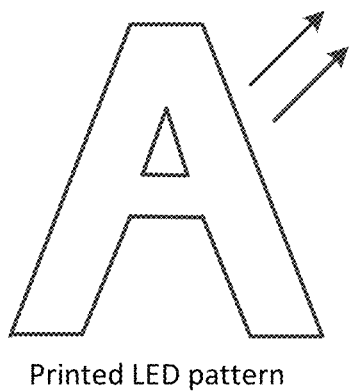
FIG. 9
FIG. 10
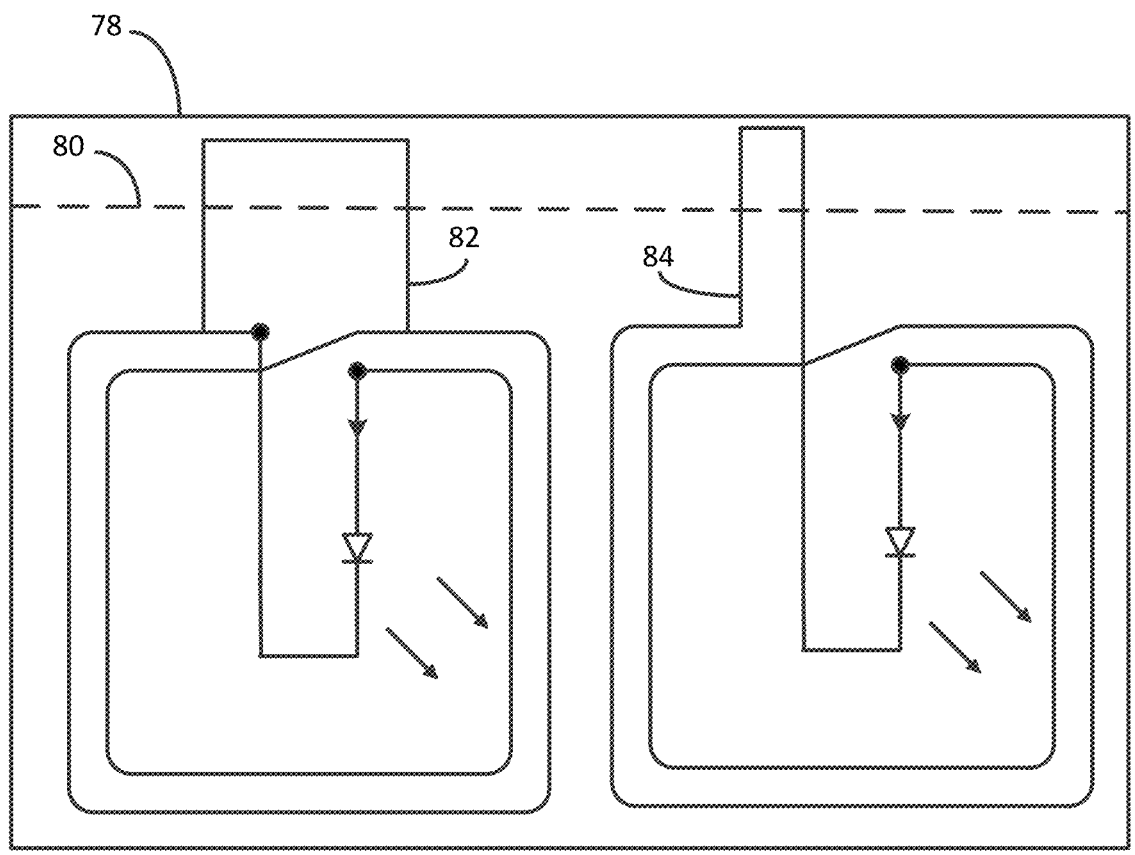
FIG. 11

NFC-POWERED LED STICKER WITH INTEGRAL CAPACITOR

CROSS-REFERENCE TO RELATED APPLICATIONS

This application claims the benefit of U.S. provisional application Ser. No. 63/007,112, filed Apr. 8, 2020.

FIELD OF THE INVENTION

This invention relates to an inductively-powered light emitting diode (LED) sticker that can be illuminated using a near field communications (NFC) transmission from a smartphone or other NFC reader.

BACKGROUND

A smartphone is able to wirelessly read NFC tags or exchange information with other smartphones using NFC signals. An NFC signal is transmitted by the smartphone at its antenna's resonant frequency of 13.56 MHz. The 13.56 MHz carrier wave is modulated to convey digital data to an NFC chip. The NFC chip contains a simple processor and limited memory. The transmit power is inductively coupled to the NFC chip by a loop antenna, and the power is used to power the components in the NFC chip as well as to convey the data. The NFC chip can then reply with stored digital data, also at 13.56 MHz. The smartphone can be used to wirelessly program the NFC chip in some cases. A similar process can be done with RFID (radio frequency identification) tags, which also use 13.56 MHz. Well-known downloadable applications for the smartphone, such as an Apple iPhone™ or an Android™ phone, can be used to program and read NFC tags, RFID tags, and exchange information with other phones using the matched antennas.

There are various products on the market or in the prior art that provide a wire loop connected in series with a conventional, low power LED. The few milliwatts of power that can be wirelessly transmitted by the smartphone or other NFC reader are capable of illuminating the LED if the phone is near enough and there is sufficient inductive coupling. Only a few milliwatts are sufficient to drive a low power LED. NFC stickers are typically designed to dissipate up to 50 mW, and the NFC chips typically consume less than 15 mW.

FIG. 1 is an example of a simple prior art LED sticker 10. A loop antenna 12 has an inductance, and the conventional low power LED 14 has a very small capacitance, on the order of a few picofarads. A conventional smartphone 16 uses an NFC application program that controls the smartphone 16 to transmit and receive a modulated signal at 13.56 MHz, using an internal antenna. The transmitted power, generally unrelated to the data transmitted, is sufficient to power the LED 14. The power in the antenna 12 is AC. The parallel LC of the circuit is not designed to resonate at 13.56 MHz since the capacitance values are so small. Therefore, the coupling between the smartphone NFC antenna and the loop antenna 12 is like that of a poor transformer. The efficiency is very low since the resonant frequencies of the two antennas do not match. Accordingly, the brightness of the LED 14 is low.

To maximize the power transfer from an NFC transmission at 13.56 MHz, the resonant frequency of the LED sticker 10, based on the inductance of the antenna 12 and the overall capacitance of the circuit, must also be 13.56 MHz. Since the resonance is related to the product LC, the inductance of the antenna must be very large since the overall capacitance is very small. This places significant design requirements on the antenna 12 to achieve a resonant frequency of 13.56 MHz. Adding more windings to the antenna 12, to increase its inductance, increases its resistance, so more power is lost.

As shown in FIG. 2, a separate resonant capacitor 20 may be added in parallel with the LED 14 to reduce the inductive requirements of the antenna 12 in order to achieve a resonance of 13.56 MHz, but such a capacitor 20 adds cost and size to the LED sticker 10.

The LED 14 is a dim point source, so the effect has only insignificant industrial uses and is mostly for amusement or aesthetics. Known uses of driving an LED using the NFC transmission of a smartphone include a fingernail sticker that illuminates when the smartphone overlies the fingernail and the NFC function is active, and LEDs embedded in a credit card that light up when the card is read by an NFC reader. See for example, https://youtu.be/GqXDqqOaQZE (credit card containing LEDs) or https://www.cnet.com/news/led-fingernail-stickers-detect-android-smartphones/ (fingernail sticker).

What is needed is an LED sticker that is wirelessly powered by a smartphone transmission or other NFC or RFID transmission, where the LED sticker maximizes the power transfer by having a resonance of 13.56 MHz while not requiring the addition of a separate capacitor.

SUMMARY

An LED sticker is described that includes a loop antenna and an optional NFC tag. The LED portion of the sticker comprises a transparent first conductive layer on a translucent or transparent substrate, printed pre-formed LEDs that have been deposited on the first conductive layer, a dielectric layer, and a reflective second conductive layer. The two conductive layers connect all the LEDs in parallel so a voltage applied across the conductive layers causes the LEDs to illuminate in any printed pattern. Light from the LEDs exits through the transparent first conductive layer and through the substrate. The substrate may be a thin translucent paper.

The conductive layers are very large compared to the printed LEDs, since the LEDs have a width less than that of a human hair, and the area of the sticker can be about 6 cm$^2$ (a square inch). The gap between the conductive layers is very small. Although there may be many microscopic printed LEDs in the sticker, their combined area is insignificant compared to the area of the conductive layers. Hence, the overall capacitance of the LED sticker is very high compared to the capacitance of the LEDs themselves. Therefore, the required inductance of the antenna to achieve the resonant frequency of 13.56 MHz is greatly reduced, simplify the design of the antenna and reducing its size and resistance. The inductance and capacitance in parallel form a resonant LC tank circuit. Accordingly, the power transfer between the smartphone's NFC transmission and the LED sticker is maximized.

Due to the relatively large capacitance of the LED sticker, there is no need to provide an additional "resonant" capacitor in the LED sticker to achieve the resonant frequency of 13.56 MHz. Further, since the loop antenna can be small, the antenna has a low resistance, to further improve efficiency.

Independent of the LED/antenna circuit, a separate NFC tag can be laminated over or under the LED sticker. The NFC tag includes an NFC chip and a resonant loop antenna. The NFC antenna may be generally overlying the LED antenna, since it is ideal for the antennas to be the same size as the smartphone NFC antenna and be directly under the smartphone NFC antenna. The NFC tag operates independently of the LED sticker. The LEDs may be positioned away from the antennas so the user can see the LEDs light when using a smartphone to energize the NFC chip and LEDs.

An NFC transmission may couple 50 mW or more into the LEDs and NFC chip, which is suitable for brightly illuminating LEDs. The smartphone's NFC signal may radiate 200 mW or more. The reading range is typically up to 10 cm. A downloadable application to the smartphone can change the NFC pulse frequency or other aspects of the NFC signal.

In one application of an adhesive LED stamp, the stamp is used as a tamper proof seal, and no NFC chip is needed. The seal may be weakened along predetermined areas so easily tears along those lines. The seal is adhered across a boundary that can be opened. If the seal is broken, the LED stamp will not light up when a smartphone applies an NFC signal to it. In another embodiment, the seal can be lit up only if the seal was broken, such as where the break in the seal breaks a conductor that previously shorted out the LEDs.

The LEDs may be printed in a pattern that conveys a message or the LEDs may backlight a logo or other graphics in a product package.

In another embodiment, the LED stamp is affixed over a pocket, and a smartphone is put in the pocket to be very close to the stamp (virtually touching), to have a high degree of magnetic coupling. The smartphone pulses the LED stamp to allow the stamp to be used in a safety vest or for other uses.

Additional uses are envisioned.

BRIEF DESCRIPTION OF DRAWINGS

FIG. 9 illustrates how energizing the seal of FIG. 8 can display "seal broken" using a pattern of LEDs or a graphic overlay.

FIG. 10 illustrates a pattern of printed LEDs in the shape of the letter "A".

FIG. 11 illustrates how a tear in the seal can disable one side of the LED sticker and enable the other side of the sticker.

Elements that are similar or identical in the various figures are labeled with the same numeral.

DETAILED DESCRIPTION OF PREFERRED EMBODIMENTS

Figure 3:
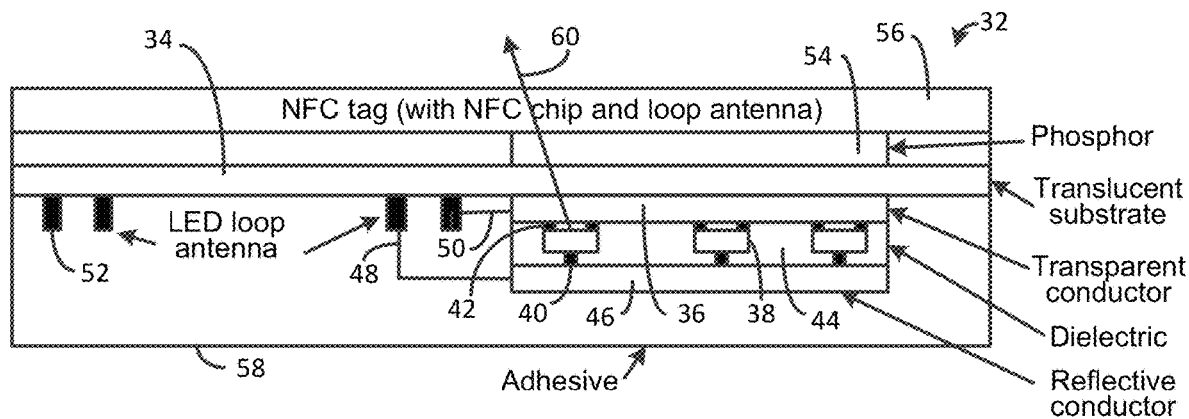
FIG. 3 illustrates an LED sticker having an array of printed micro-LEDs sandwiched between two conductive layers to create an integrated large capacitor in parallel with the small capacitances of the micro-LEDs. The LED sticker also includes an independent NFC tag with its own antenna and NFC chip.

FIG. 3 is a cross-section of one embodiment of an LED sticker 32 in accordance with one embodiment of the invention. FIG. 3 illustrates how a relatively large capacitor can be integrally formed with a layer of printed micro-LEDs, obviating the need for a separate "resonant" capacitor to achieve the 13.56 MHz resonant frequency. The capacitance may be on the order of 500 pF/mm$^2$, and the size of the LED portion of the LED sticker 32 will typically be about 1 cm$^2$ or less. The LED sticker 32 may be on the order of one square inch to accommodate the loop antenna. All aspects of the LED sticker 32 may be formed by printing in atmospheric conditions.

In FIG. 3, the LED sticker 32 is oriented upward so light is emitted from its top surface. When fabricating the LED portion of the LED sticker 32, the orientation is reversed.

A thin flexible substrate 34, such as PET, PMMA, Mylar, paper, etc., is first provided. The substrate 34 is translucent or transparent. In the preferred embodiment, the substrate 34 is a thin, white paper by Arjo Wiggins, Inc. If the substrate 34 is not conductive, a transparent first conductive layer 36 is deposited on the substrate 34, such as by printing or lamination. The first conductive layer 36 may be ITO or a sintered silver wire mesh (after curing). The fabrication process may be a reel-to-reel process.

Pre-formed, microscopic inorganic LEDs 38 are prepared in a solution as an LED ink. The LED ink may be printed in any pattern using screen printing, gravure, flexography, inkjet, or other techniques. The orientation of the printed LEDs 38 can be controlled by providing a relatively tall electrode 40 (e.g., the anode electrode), so that the electrode 40 orients upward by taking the fluid path of least resistance through the solvent after printing. Note that, during fabrication, the LEDs 38 are oriented in the opposite direction relative to FIG. 3. By providing a heavier cathode electrode 42, the LEDs 38 also self-orient. The cathode electrodes 42 may be distributed metal electrodes, and the LED light is emitted between the distributed metal electrodes. The LEDs 38 are referred to as vertical LEDs since current travels vertically through the structure. The anode and cathode surfaces may be opposite to those shown. The precise locations of the LEDs 38 are random, but the approximate number of LEDs 38 printed per unit area can be controlled by the density of LEDs 38 in the ink. A monolayer of LEDs 38 is achieved by the printing process. The printed LED ink is then cured, causing the cathode electrode 42 to electrically connect to the first conductive layer 36.

A dielectric layer 44 is then deposited over the first conductive layer 36 and between the LEDs 38, then cured.

A reflective conductive layer 46, such as ITO or a silver nano-wire ink, is then deposited over the LEDs 38 and dielectric layer 44 to connect the LEDs 38 in parallel. The conductive layer 46 is then cured. In the case of the silver nano-wire ink, the curing sinters the nano-wires to form a mesh.

The loop antenna 52 is then deposited on the same side of the substrate 34 or on the other side of the substrate 34 to form a flat spiral having two ends connected to the conductive layers 36 and 46.

A phosphor layer 54 is optionally deposited over the LED portion, such as a YAG phosphor to create white light using blue-emitting GaN-based LEDs 38. The blue light may combine with the phosphor emission to provide a wide spectrum emission. Any other phosphor may be used to create any color.

Any suitable material may then be deposited to make the surfaces of the LED sticker 32 planar.

An NFC tag 56 may optionally be adhered to the top or bottom surface of the LED sticker 32. The NFC tag 56 operates independently of the LED portion and includes its own loop antenna and NFC chip. The NFC tag 56 may be conventional and may be circular or rectangular. A typical NFC tag includes a resonant capacitor of about 68 pF and a loop antenna having an inductance of 2 µH. If the NFC tag 56 overlies the LEDs 38, the NFC tag 56 should be translucent and preferably transparent, except for its antenna and NFC chip. The NFC chip receives power from its loop antenna and receives and transmits data via its loop antenna. The NFC chip may be wirelessly programmed by the smartphone and may transmit any suitable digital data to the smartphone.

An adhesive layer 58 and any protective layer may then be deposited to allow the LED sticker 32 to be adhered to any surface.

When the smartphone transmits an NFC signal within about 10 cm from the LED sticker 32, the signal is inductively coupled to the loop antennal 52, to energize the LEDs 38, and also inductively coupled to the NFC antenna to communicate with the NFC chip. A light ray 60 is shown being emitted by the LEDs 38.

The translucent substrate 34 and the phosphor 54 diffuse the LED light for a more uniform light emission.

In one embodiment, the light emission from the LEDs 38 and phosphor backlight color or opaque graphics printed on the paper substrate 34 to convey a logo or a message.

More information about forming the LED ink and printing the ink to form an array of LEDs sandwiched between two conductive layers may be found in the assignee's U.S. Pat. No. 9,343,593, entitled, Printable Composition of a Liquid or Gel Suspension of Diodes, and related patents, incorporated herein by reference.

Since each LED 38 is microscopic, such as having a width of 50 microns or less, and the LED sticker 32 may be a square on the order of 6 cm$^2$, the total LED area is miniscule compared to the conductive layer area. The gap between the conductive layers 36 and 46 is very small, such as less than 50 microns, and the surface area is very large, resulting in a relatively large capacitance. Therefore, no extra "resonant" capacitor is needed to achieve resonance.

Figure 4:
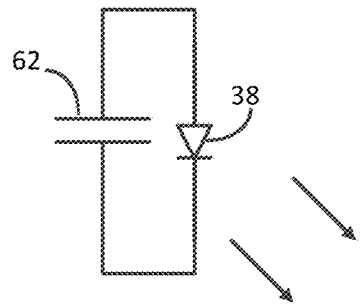
FIG. 4 is a schematic diagram of the LEDs and integrated capacitor of FIG. 3. The capacitor value is used in determining the required inductance of the antenna to achieve a resonant frequency of 13.56 MHz.

FIG. 4 is a schematic diagram of the LED sticker 32, showing the conductive layers 36 and 46 as the capacitor 62 and showing the LEDs 38 in parallel with the capacitor 62. The area of the conductive layers 36 and 46 may be made larger or smaller irrespective of the LED ink pattern in order to achieve a desired capacitance value, such as if using a loop antenna with a predetermined inductance, in order to obtain the resonant frequency of 13.56 MHz.

Figure 5:
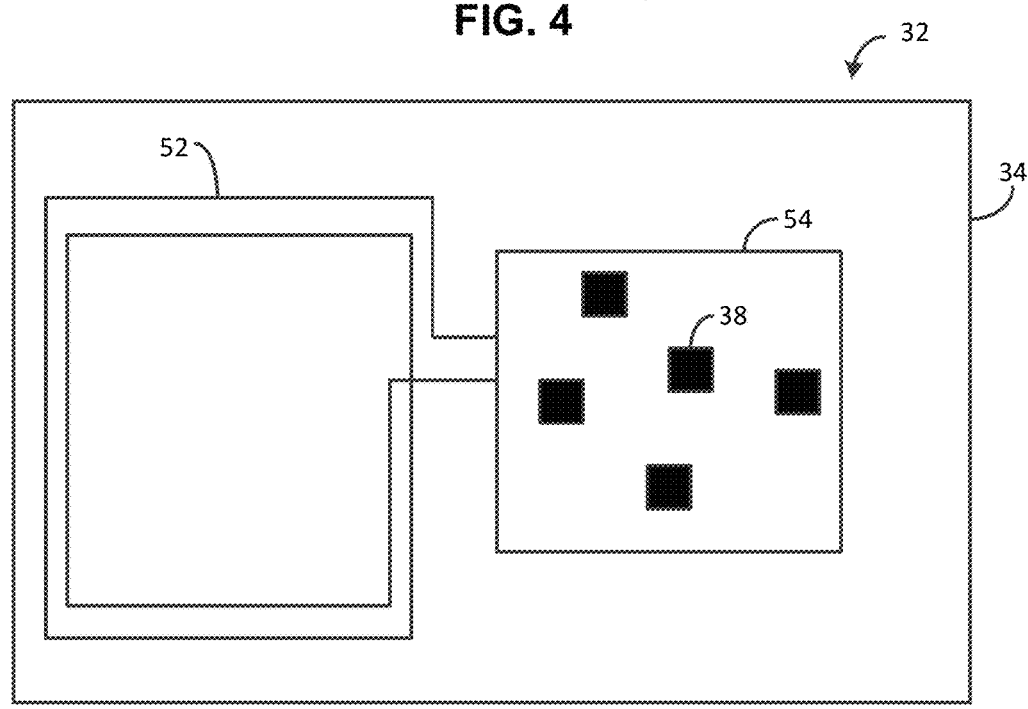
FIG. 5 is a top down view of some aspects of the LED structure of FIG. 3. The density of LEDs can be much higher, and the LEDs can be printed in any pattern, such as an alpha-numeric pattern or a logo.

FIG. 5 is a top view of the LED portion of the LED sticker 32. The LEDs 38 may be printed in any pattern, such as a generally uniform pattern, an alpha-numeric pattern, or a logo pattern.

The antennal 52 should be designed so that the overall inductance and capacitance of the circuit has a resonance of 13.56 MHz for optimal transfer of power. The inductance and capacitance form a parallel resonant LC tank circuit. Maximum power is transferred between the smartphone transmitting at 13.56 MHz and the passive receiving circuit having a resonance of 13.56 MHz. The formula for resonant frequency is $f=1/(2\pi\sqrt{LC})$. The capacitance value depends on the area of the conductive layers 36/46, the dielectric layer 44, and the gap between the conductive layers 36/46. It is well-known how to test a circuit for a resonant frequency of 13.56 MHz using an impedance analyzer. The capacitance can be varied as required with a given antenna design to achieve the resonance of approximately 13.56 MHz for the maximum power transference. The smartphone antenna and the LED sticker antenna should ideally have the same shape.

The size of the integral capacitor should be limited to a relatively small area, such as less than 1 cm$^2$, since a smaller capacitor results in a higher voltage across the LEDs 38. When the voltage across the LEDs 38 reaches about 2.5V (the approximate forward voltage of the LEDs 38), the LEDs 38 will turn on.

Since the capacitance is much larger than the capacitance of the LEDs 38 themselves, a smaller loop antenna 52 can be used, which reduces its resistance, improving efficiency.

Typically, an NFC reader transmits in pulses while polling for an NFC chip transmission to save power and reduce interference. Therefore, the LEDs 38 will pulse at the NFC pulse rate, which may be a few times per second. An application in the smartphone may be used to change the pulse rate or make the transmission continuous. If the NFC reader detects an NFC chip, the NFC transmission time may be longer.

Figure 1:
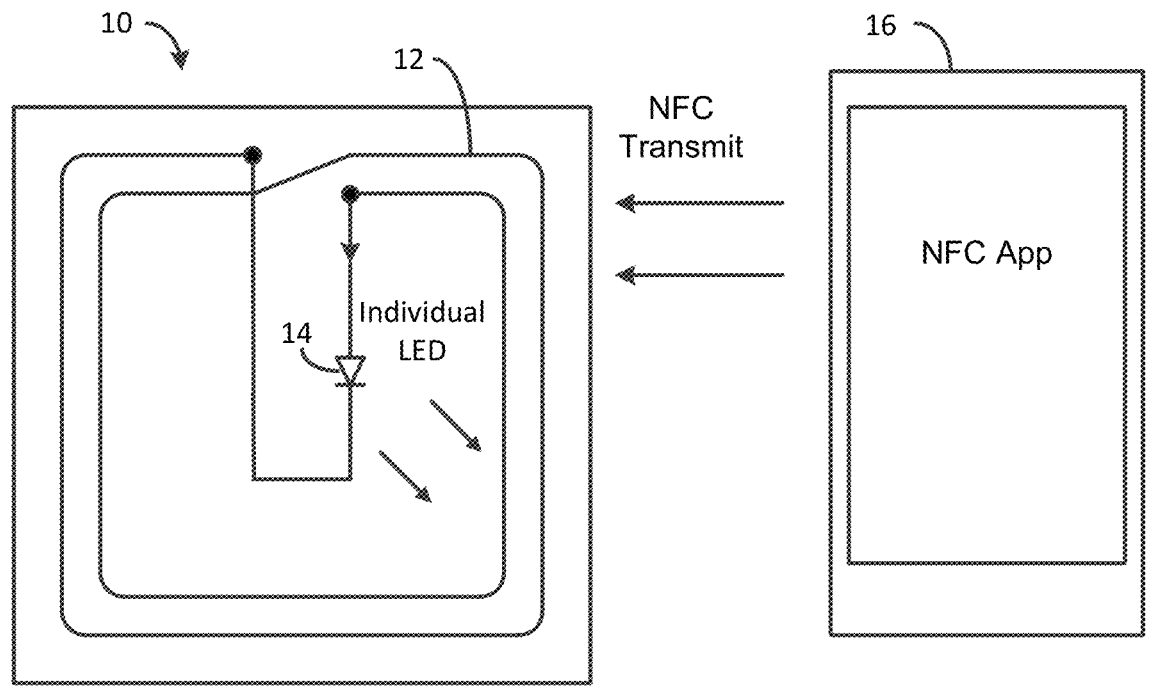
FIG. 1 is a schematic circuit of a simple LED circuit that receives wireless power from an NFC pulse from a smartphone, where the circuit does not have a resonant frequency of 13.56 MHz so is very inefficient.
Figure 2:
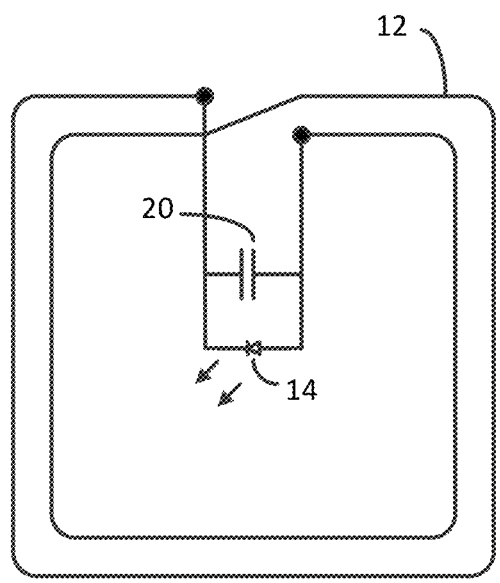
FIG. 2 illustrates how the circuit of FIG. 1 can be configured to include a "resonant" capacitor to reduce the inductance requirements of the antenna and maximize the power transfer.

Although the NFC resonance frequency of 13.56 MHz is ideal for maximum transference of power, the resonance frequencies do not have to match, albeit with a reduction in efficiency. For example, a resonance within 30% of the resonance of the NFC antenna will exhibit improved performance over the LED sticker of FIG. 1, where the coupling is like a poor transformer. Other systems may use other resonant frequencies, and the LED sticker 32 can be modified to achieve virtually any resonant frequency.

Various practical uses of the LED sticker 32 will now be described, although there are many other uses that will become apparent. Some uses include: 1) visual feedback that the LED sticker 32 is within an NFC field; 2) visual indication that a seal has been broken or unbroken; 3) a safety light powered by the NFC field emitted by a smartphone; 4) a product package augmentation that conveys information to the customer when the customer energizes the LED sticker 32 with a smartphone.

FIGS. 6-12 show various techniques for using the LED sticker as an indicator when a seal has been broken.

Figure 6:
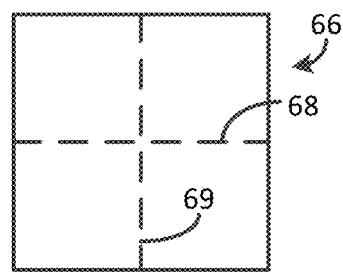
FIG. 6 illustrates how the LED sticker can be weakened along predetermined lines so, when used as a seal across a boundary, breaking the seal will create an open circuit, causing the LED sticker to not illuminate in the presence of an NFC signal after the seal is broken.

In FIG. 6, an LED sticker 66, similar to the LED sticker 32 of FIG. 3, is shown having weakened areas 68 and 69 (dashed lines), such as by partially perforating the outer protective layer of the LED sticker 66. The LED sticker 66 is easily torn along those weakened areas 68 and 69.

Figure 7:
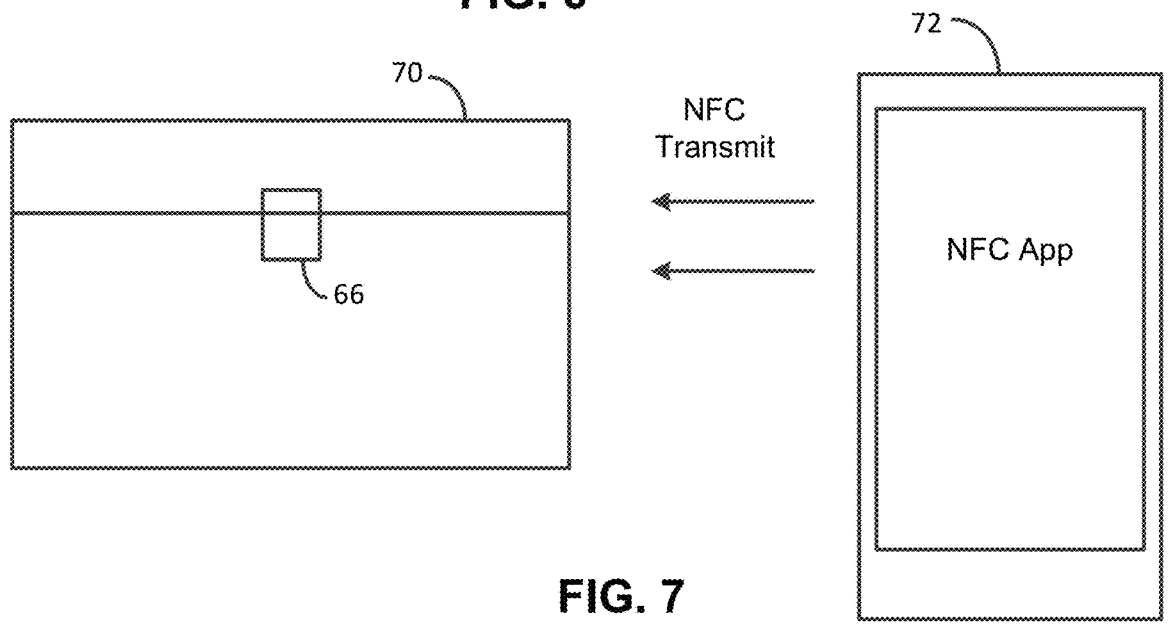
FIG. 7 illustrates the LED sticker of FIG. 6 being used as a seal for a parcel.

FIG. 7 shows the LED sticker 66 being used as a seal across a boundary of a parcel 70, such as an envelope or other package. To ensure the parcel 70 flap has not been opened, the user reads the LED sticker 66 with an NFC transmission of a smartphone 72. The LED lights up and any data in the NFC chip may be read, or the NFC chip can be written into. For example, the NFC chip can be written into to convey that the seal has been examined at a certain time and the seal is still in-tact. In this manner, the state of the seal can be tracked if different entities are responsible for the parcel 70. If the seal is torn, the tear would open up the delicate trace forming the antenna or the LED portion, rendering the LED sticker 66 inoperable and not repairable.

In another embodiment, one LED sticker is adhered over the sealed opening of a wine bottle to convey whether the seal has been broken or not. Another LED sticker is placed on the wine label and, when energized, conveys information about the wine.

Figure 8:
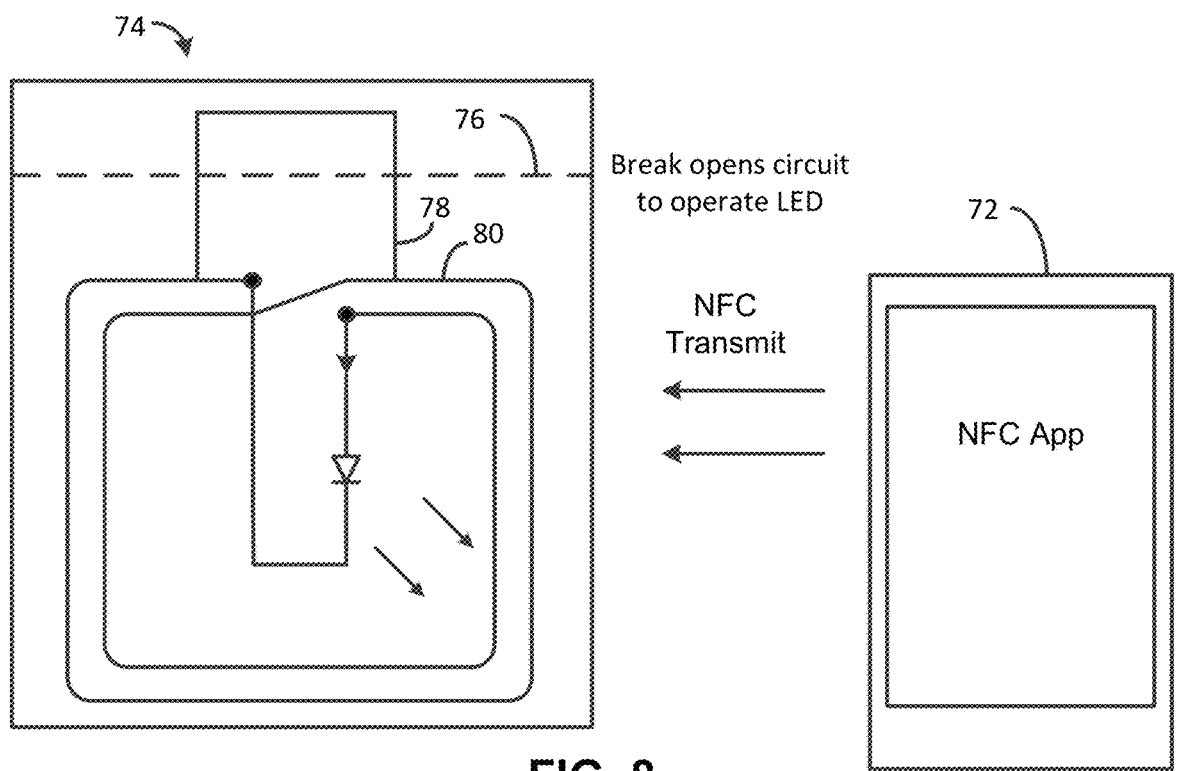
FIG. 8 illustrates how breaking the seal can be used to make the LED sticker operable by removing a short across the LED.

FIG. 8 illustrates a technique for causing the LED sticker 74 to be operable only if it is torn along the weakened area 76. A thin metal trace 78 normally shorts out the antenna loop 80, rendering the LED sticker 74 inoperable. When the trace is broken 78 by tampering, the LED sticker 74 becomes operable and illuminates when energized by the NFC transmission of the smartphone 72.

FIG. 9 illustrates how the LED sticker 74 can visually convey alpha-numeric characters that identify the status of the seal. In one example, the LED sticker 74 backlights graphics printed on a translucent or transparent sheet 75. A light guide layer may be used to laterally spread the LED light, and the surface of the light guide layer may be patterned (e.g., roughened) to emit light in only the patterned areas. In another embodiment, the patterning of the LED ink forms characters, such as the letter "A" in FIG. 10. Any size LED sticker 74 can be used to show any words or logos. This applies to all the LED stickers described herein.

FIG. 11 illustrates an LED sticker 78 that has a weakened area 80, where a tear along the weakened area 80 causes the left portion of the LED sticker 78 to be operable, by opening up the shorting trace 82, and the right portion of the LED sticker 78 to be inoperable, by breaking the antenna loop trace 84.

Figure 12:
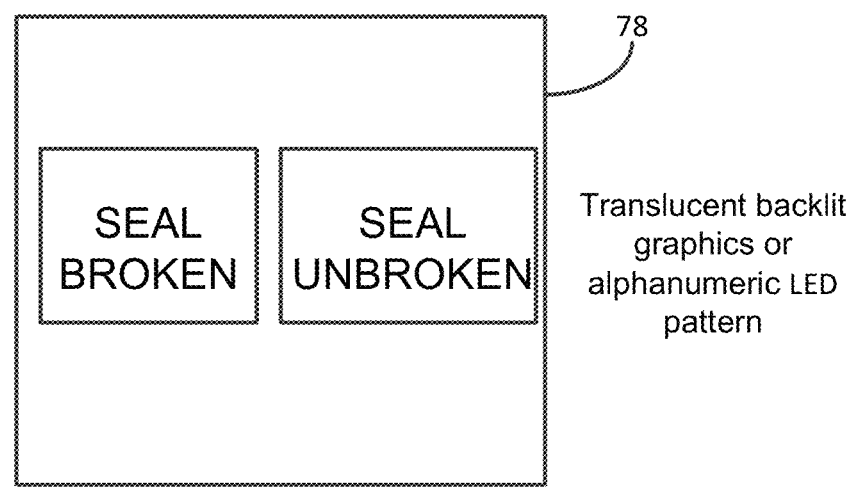
FIG. 12 illustrates how energizing the seal of FIG. 11 can display to the user that the seal is broken or unbroken. Only one of the messages will be displayed.

As shown in FIG. 12, energization by the NFC transmission from a smartphone will convey to the user whether the seal is broken or unbroken by either backlit graphics or the LEDs being printed in alpha-numeric patterns.

Figure 13:
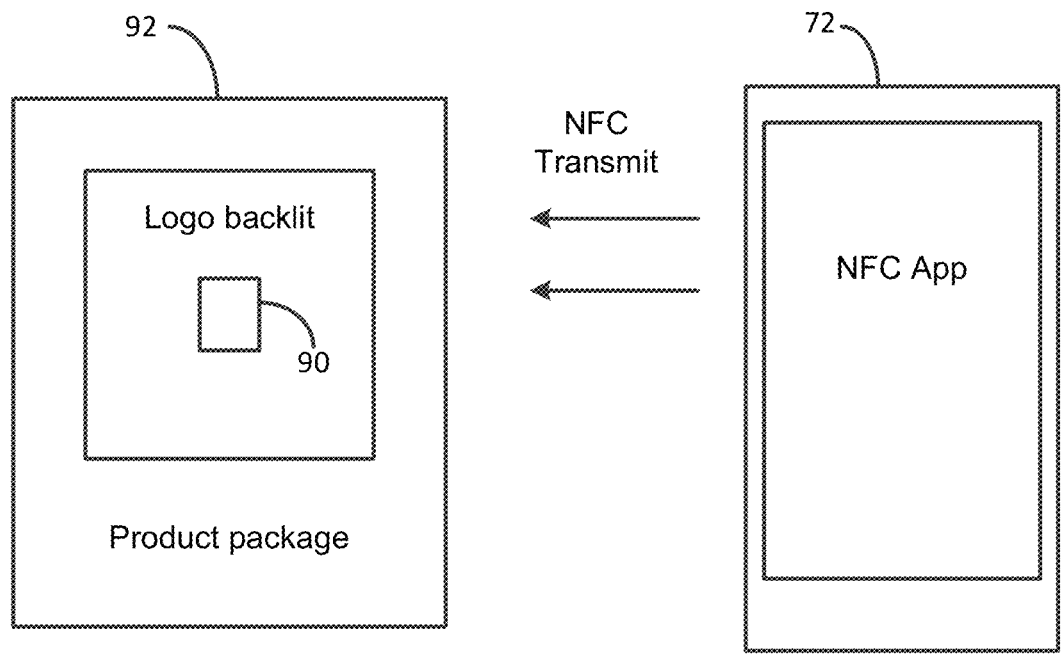
FIG. 13 illustrates how the LED sticker can convey a message or a logo when used in a product package, where the LED sticker is energized by the NFC transmission of a customer's smartphone.

FIG. 13 illustrates how an LED sticker 90 can be used in packaging. The LED sticker 90 is placed on or in a product package 92. Energization of the LED sticker 90 by a customer's smartphone 72 may convey information to the customer, such as words, a logo, a "secret" message, a prize, etc. The LEDs may backlight graphics or convey a message directly. Or the illumination may just provide feedback that an NFC chip is being read. An NFC chip on the LED sticker 90 may also convey any other message to the customer.

Figure 14:
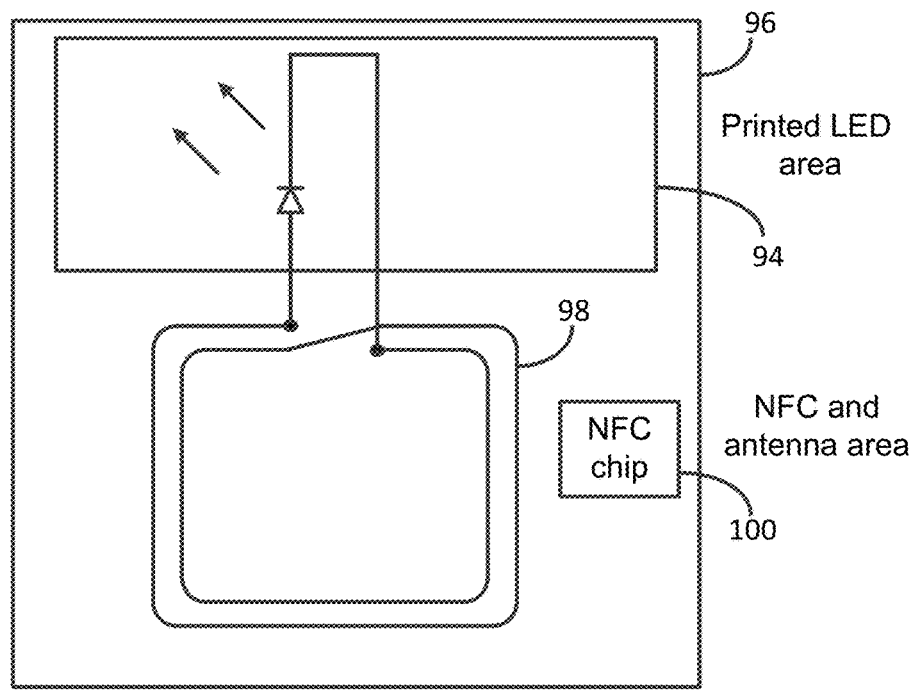
FIG. 14 illustrates how the LED area can be any size compared to the antenna area.

FIG. 14 illustrates how the LED area 94 in an LED sticker 96 can be independent of the size of the loop antenna 98. The NFC chip 100 and NFC antenna may be located anywhere on the LED sticker 96.

Figure 15:
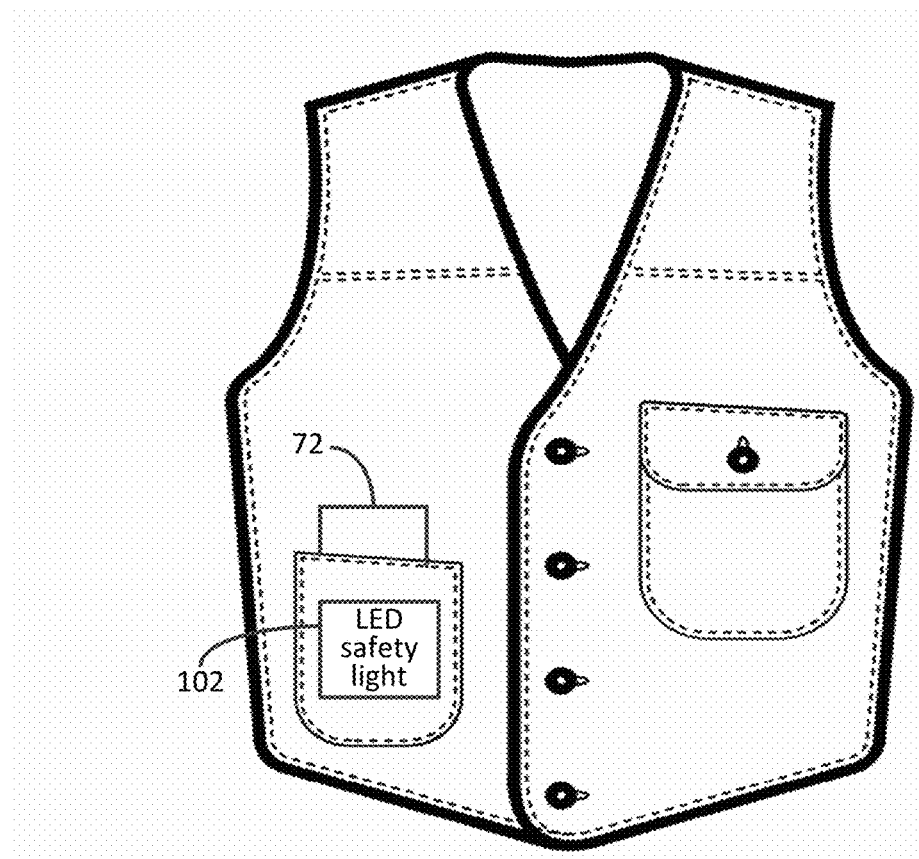
FIG. 15 illustrates how the LED sticker can be used as a safety light, where the user's smartphone is placed in a pocket behind the LED sticker and periodically transmits an NFC signal to the LED sticker. An application downloaded to the phone can select the power and pulse frequency of the NFC signal.

FIG. 15 illustrates how the LED sticker 102 may be used as an LED safety light on an article of clothing. The LED sticker 102 is adhered over a pocket, and a smartphone 72 is placed in the pocket so the smartphone's NFC antenna loop is very close to the LED sticker 102 antenna, resulting in very high magnetic coupling. An application in the smartphone 72 can be used to control the pulse frequency and power so the LEDs flash brightly for safety. Many other applications are envisioned for illuminating the LED sticker for safety or other purposes.

Any of the features of the various embodiments can be combined.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A structure comprising:
   a substrate;
   an antenna supported by the substrate, the antenna having an inductance;
   a first conductive layer;
   a plurality of light emitting diodes (LEDs) deposited over the first conductive layer, the LEDs having a first electrode making electrical contact with the first conductive layer;
   a dielectric layer overlying the first conductive layer and between the LEDs;
   a second conductive layer overlying the dielectric layer and the LEDs, the LEDs having a second electrode making electrical contact with the second conductive layer such that the first conductive layer and the second conductive layer connect the LEDs in parallel and form a first capacitor; and
   the first conductive layer and the second conductive layer being electrically coupled to the antenna for generating a voltage differential across the LEDs to illuminate the LEDs in the presence of a near-field communication (NFC) transmission,
   wherein an inductance of the antenna, and any other inductances and capacitances in electrical components on the substrate, are combined with a capacitance of the first capacitor to set a resonance frequency of approximately a frequency of the NFC transmission for efficient power transfer.

2. The structure of claim 1 further comprising an NFC tag supported by the substrate, the NFC tag comprising an NFC chip and an NFC antenna.

3. The structure of claim 1 further comprising weakened areas that tear when stressed, such that the structure forms an easily tearable seal.

4. The structure of claim 1 further comprising an adhesive layer.

5. The structure of claim 1 wherein the LEDs are arranged in a pattern to convey a message when illuminated.

6. The structure of claim 1 wherein the LEDs are arranged in a pattern to convey a logo when illuminated.

7. The structure of claim 1 wherein the LEDs cannot be illuminated by the NFC transmission if the structure is torn and opens a circuit on the structure.

8. The structure of claim 1 further comprising a shorting conductor that prevents illumination of the LEDs unless the structure is torn to open the shorting conductor.

9. The structure of claim 1 wherein the structure is configured for use as a seal, wherein operation of the LEDs is dependent on whether the seal is broken or unbroken.

10. The structure of claim 1 further comprising:
a product package,
wherein exposing the product package to the NFC transmission causes the LEDs to be illuminated.

11. The structure of claim 1 wherein the resonance frequency is within 30% of the frequency of the NFC transmission.

12. The structure of claim 1 further comprising a pocket of a garment, wherein the structure is adhered to an outer surface of the pocket, and the pocket is configured for receiving a smartphone having NFC transmission capabilities.

13. The structure of claim 1 further comprising an NFC chip, where the NFC chip is powered, and the LEDs are illuminated, when an NFC signal is transmitted proximate to the structure.

14. The structure of claim 1 wherein the LEDs are pre-formed inorganic, microscopic LEDs that have been printed over the first conductive layer.

15. The structure of claim 1 wherein the NFC transmission is transmitted by a smartphone.

16. The structure of claim 1 wherein the NFC transmission is approximately 13.56 MHz.

17. A method for designing a structure comprising:
providing a substrate;
forming an antenna on the substrate, the antenna having an inductance;
forming a first conductive layer;
depositing light emitting diodes (LEDs) over the first conductive layer, the LEDs having a first electrode making electrical contact with the first conductive layer;
depositing a dielectric layer overlying the first conductive layer and between the LEDs;
forming a second conductive layer overlying the dielectric layer and the LEDs, the LEDs having a second electrode making electrical contact with the second conductive layer such that the first conductive layer and the second conductive layer connect the LEDs in parallel and form a first capacitor;
the first conductive layer and the second conductive layer being electrically coupled to the antenna for generating a voltage differential across the LEDs to illuminate the LEDs in the presence of a near-field communication (NFC) transmission by a smartphone; and
designing the antenna to have an inductance such that the antenna in combination with the first capacitor and other capacitances have a resonance frequency of approximately a frequency of the NFC transmission for efficient power transfer.

18. The method of claim 17 further comprising coupling an NFC chip to receive power from the NFC transmission.

19. The method of claim 17 wherein the LEDs are arranged in a pattern to convey a message when illuminated.

20. The method of claim 17 wherein the LEDs are arranged in a pattern to convey a logo when illuminated.

21. The method of claim 17 wherein the NFC transmission is approximately 13.56 MHz.

22. The method of claim 17 wherein the resonance frequency is within 30% of the frequency of the NFC transmission.

* * * * *